United States Patent [19]

Iwata

[11] Patent Number: 5,446,398

[45] Date of Patent: Aug. 29, 1995

[54] SAMPLING FREQUENCY CONVERTER

[75] Inventor: Toshio Iwata, Sagamihara, Japan

[73] Assignee: Kabushiki Kaisha Kenwood, Tokyo, Japan

[21] Appl. No.: 151,824

[22] Filed: Nov. 15, 1993

[30] Foreign Application Priority Data

Nov. 16, 1992 [JP] Japan ................. 4-329003

[51] Int. Cl.⁶ ............................................. H03M 7/30
[52] U.S. Cl. ................................... 327/113; 327/117; 327/91; 341/61
[58] Field of Search ............................ 328/15, 151, 16; 302/271, 529; 341/61, 122, 123

[56] References Cited

U.S. PATENT DOCUMENTS

| | | | |
|---|---|---|---|
| 4,472,785 | 9/1984 | Kasuga | 364/718 |
| 4,903,019 | 2/1990 | Ito | 341/61 |
| 5,227,787 | 6/1993 | Kurashina | 341/61 |
| 5,327,125 | 7/1994 | Iwase et al. | 341/61 |

OTHER PUBLICATIONS

IEEE Transactions on Instrumentation and Measurement, vol. 36, No. 4, Dec. 1987, New York US pp. 979–982, XP32389 P. S. Tang et al. "Applications of a Multichannel Digital Waveform Recorder With Mixed and Switchable Sampling Rate".

Primary Examiner—Timothy P. Callahan
Assistant Examiner—Dinh Le
Attorney, Agent, or Firm—Sixbey, Friedman, Leedom & Ferguson; Gerald J. Ferguson, Jr.; Eric J. Robinson

[57] ABSTRACT

A sampling frequency converter capable of obtaining data sampled by sampled pulses having a sampling frequency of 2-, 4-, or 8-fold of 44.1 kHz without using an over-sampling filter. Input data sampled by sampling pulses having a sampling frequency of 32 kHz is over-sampled by a 3-fold by a first over-sampling filter, and down-sampled by a one-2nd-fold by a first down-sampling filter. One of input data sampled by sampling pulses having a sampling frequency of 48 kHz and the output of the first down-sampling filter is selected by a first selector. The output of the selector is over-sampled by a 147-fold by a second over-sampling filter, and down-sampled by a one-20th-fold by a second down-sampling filter. The output of the second down-sampling filter is down-sampled by one-2nd-, one-4th-, and one-8th-folds respectively by third, fourth, and fifth down-sampling filters. One of the outputs of the second to fifth down-sampling filters is selected by a second selector.

2 Claims, 3 Drawing Sheets

SAMPLING FREQUENCY CONVERTER

BACKGROUND OF THE INVENTION

1. Field of the Invention

The present invention relates to a sampling frequency converter which converts input data sampled by sampling pulses having a sampling frequency of 32 kHz or 48 kHz into output data sampled by sampling pulses having a sampling frequency of 44.1 kHz.

2. Related Background Art

FIG. 3 shows a conventional sampling frequency converter which converts input data sampled by sampling pulses having a sampling frequency of 32 kHz or 48 kHz into output data sampled by sampling pulses having a sampling frequency of 44.1 kHz. As shown in FIG. 3, input data sampled by sampling pulses having a sampling frequency of 32 kHz is over-sampled by a three-fold by an over-sampling filter 21, and the output of the over-sampling filter 21 is down-sampled by a one-2nd-fold by a down-sampling filter 22. The output of the down-sampling filter 22 and input data sampled by sampling pulses having a sampling frequency of 48 kHz are supplied to a selector 23. The data selected by the selector 23 is over-sampled by a 147-fold by an over-sampling filter 24 and down-sampled by a one-160th-fold by a down-sampling filter 25. In this manner, the output data sampled by sampling pulses having a sampling frequency of 44.1 kHz is obtained.

In obtaining an analog signal converted from data sampled by sampling pulses having a sampling frequency of 2-, 4-, or 8-fold of 48 kHz by using the conventional sampling frequency converter 40, and in recording data sampled by sampling pulses having a sampling frequency of 44.1 kHz in a recording medium, the circuit shown in FIG. 4 has been used. Namely, input data sampled by sampling pulses having a frequency of 48 kHz is over-sampled by an over-sampling filter 26 to obtain output data sampled by sampling pulses having a sampling frequency of 2-, 4-, or 8-fold of 48 kHz, and the over-sampled data is converted into an analog signal by a D/A converter 27.

In obtaining an analog signal converted from data sampled by sampling pulses having a sampling frequency of 2-, 4-, or 8-fold of 44.1 kHz, and in recording data sampled by sampling pulses having a sampling frequency of 44.1 kHz in a recording medium, the circuit shown in FIG. 5 has been used. Namely, the output data converted by the sampling frequency converter 40 into the data sampled by sampling pulses having a sampling frequency of 44.1 kHz is over-sampled by an over-sampling filter 28 to obtain data sampled by sampling pulses having a sampling frequency of 2-, 4-, or 8-fold of 44.1 kHz, and the over-sampled data is converted into an analog signal by a D/A converter 29.

In recording data sampled by sampling pulses having a sampling frequency of 2-, 4-, or 8-fold of 44.1 kHz in a recording medium, the circuit shown in FIG. 6 has been used. Namely, the output data converted by the sampling frequency converter 40 into the data sampled by sampling pulses having a sampling frequency of 44.1 kHz is over-sampled by an over-sampling filter 30 to obtain data sampled by sampling pulses having a sampling frequency of 2-, 4-, or 8-fold of 44.1 kHz, and the over-sampled data is encoded by an encoder 31.

The conventional circuits shown in FIGS. 4 to 6 require the over-sampling filter which is associated with the problem of degrading the characteristics of sampled data.

SUMMARY OF THE INVENTION

It is an object of the present invention to provide a sampling frequency converter capable of obtaining data sampled by sampled pulses having a sampling frequency of 2-, 4-, or 8-fold of 44.1 kHz without using an over-sampling filter.

According to one aspect of the present invention, there is provided a sampling frequency converter having: a first over-sampling filter for over-sampling by a 3-fold input data sampled by sampling pulses having a sampling frequency of 32 kHz; a first down-sampling filter for down-sampling by a one-2nd-fold the output of the first over-sampling filter; a first selector for selecting one of input data sampled by sampling pulses having a sampling frequency of 48 kHz and the output data of the first down-sampling filter; a second over-sampling filter for over-sampling by a 147-fold the output data of the first selector; a second down-sampling filter for down-sampling by a one-20th-fold the output of the second over-sampling filter; third, fourth, and fifth down-sampling filters for down sampling respectively by one-2nd-, one-4th-, and one-8th-folds the output of the second down-sampling filter; and a second selector for selecting one of the output data of the second, third, fourth, and fifth down-sampling filters.

In the sampling frequency converter of this invention, input data sampled by sampling pulses having a sampling frequency of 32 kHz is over-sampled by a 3-fold by the first over-sampling filter, and down-sampled by a one-2nd-fold by the first down-sampling filter, to thereby obtain data sampled by sampling pulses having a sampling frequency of 48 Khz. One of input data sampled by sampling pulses having a sampling frequency of 48 Khz and the output of the first down-sampling filter is selected by the first selector. The output of the selector is over-sampled by a 147-fold by the second over-sampling filter, and down-sampled by a one-20th-fold by the second down-sampling filter, to thereby obtain data sampled by sampling pulses having a sampling frequency of 8 * 44.1 kHz.

The output of the second down-sampling filter is down-sampled by one-2nd-, one-4th-, and one-8th-folds respectively by the third, fourth, and fifth down-sampling filters, to thereby obtain data sampled by sampling pulses having sampling frequencies of 4 * 44.1 kHz, 2 * 44.1 kHz, and 44.1 kHz. One of the outputs of the second to fifth down-sampling filters is selected by the second selector to obtain output data.

Accordingly, in obtaining an analog signal converted from, or in recording on a recording medium, one of output data sampled by sampling pulses having sampling frequencies of 8 * 44.1 kHz, 4 * 44.1 kHz, 2 * 44.1 kHz, and 44.1 kHz, it is not necessary to use an over-sampling filter.

DETAILED DESCRIPTION OF THE PREFERRED EMBODIMENTS

An embodiment of the present invention will be described with reference to the accompanying drawings.

Figure 1:
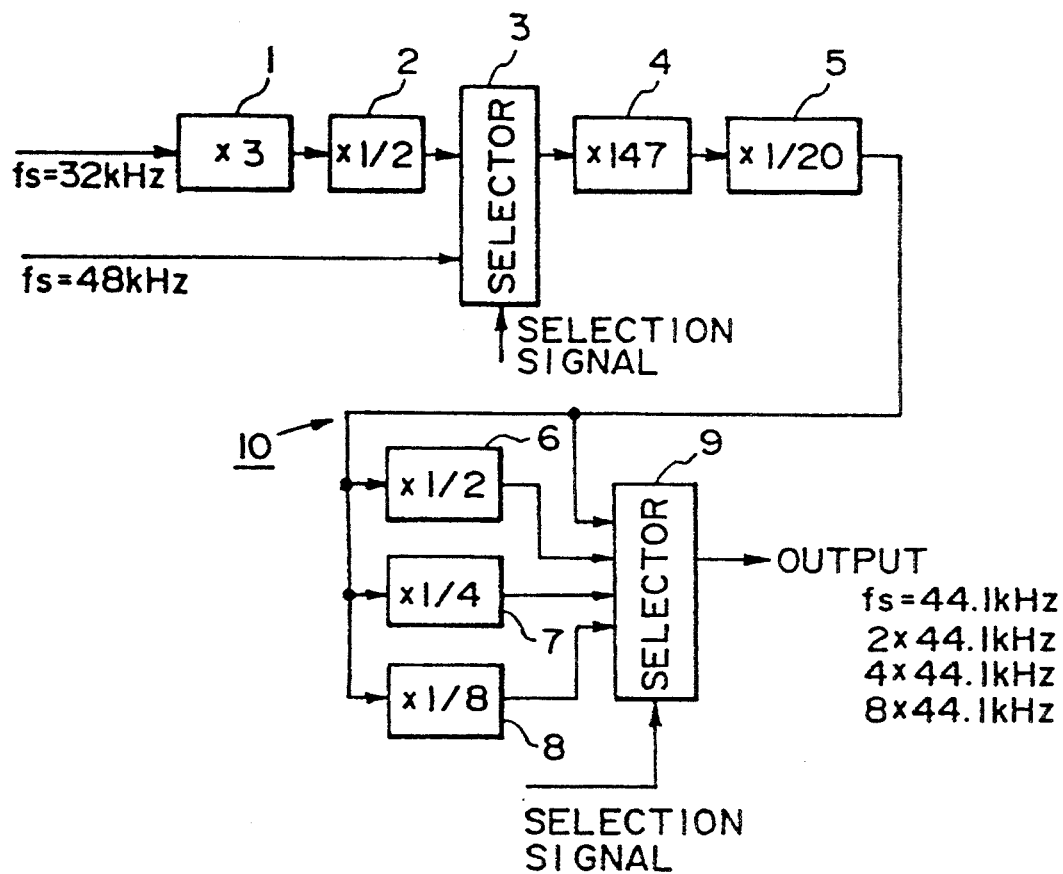
FIG. 1 is a block diagram showing the structure of a sampling frequency converter according to an embodiment of the present invention.

FIG. 1 is a block diagram showing the structure of the sampling frequency converter according to the embodiment of the invention.

In the sampling frequency converter 10 of this embodiment, input data sampled by sampling pulses having a sampling frequency of 32 kHz is over-sampled by a 3-fold by an over-sampling filter 1, and down-sampled by a one-2nd-fold by a down-sampling filter 2. Input data sampled by sampling pulses having a sampling frequency of 48 kHz and the output of the down-sampling filter 2 are supplied to a selector 3 which selects one of the two inputs in accordance with a selection signal supplied to the selector 3.

The data selected by the selector 3 is over-sampled by a 147-fold by an over-sampling filter 4, and down-sampled by a one-20th-fold by a down-sampling filter 5.

The output of the down-sampling filter 5 is down-sampled by one-2nd-, one-4th-, and one-8th-folds respectively by third, fourth, and fifth down-sampling filters 6, 7, and 8. The outputs of the down-sampling filters 5 to 8 are supplied to a selector 9 which selects one of the inputted data in accordance with a selection signal supplied to the selector 9.

The operation of the sampling frequency converter constructed as above will be described.

Input data sampled by sampling pulses having a sampling frequency of 32 kHz is over-sampled by a 3-fold by the over-sampling filter 1, and down-sampled by a one-2nd-fold by the down-sampling filter 2.

Accordingly, as the output data of the down-sampling filter 2, there is obtained the data sampled by sampling pulses having the sampling frequency of 48 kHz converted from the data sampled by sampling pulses having the frequency of 32 kHz. The output data of the down-sampling filter 2 and the other input data are both sampled by sampling pulses having the frequency of 48 kHz, which are supplied to the selector 3.

Selected in accordance with the selection signal supplied to the selector 3 is one of the data sampled by sampling pulses having the sampling frequency of 48 kHz and the output data of the down-sampling filter 2. The data selected by the selector 3 is over-sampled by a 147-fold by the over-sampling filter 4, to thereby obtain the data sampled by sampling pulses having a sampling frequency of 7056 kHz.

The output data of the over-sampling filter 4 is down-sampled by a one-20th-fold by the down-sampling filter 5, to thereby obtain the data sampled by sampling pulses having a sampling frequency of 352.8 kHz which corresponds to the data sampled by sampling pulses having a sampling frequency of 8 * 44.1 kHz.

The output of the down-sampling filter 5 is down-sampled by one-2nd-, one-4th-, and one-8th-folds respectively by the down-sampling filters 6, 7, and 8, to thereby obtain the data sampled by sampling pulses having the sampling frequencies of 4 * 44.1 kHz, 2 * 44.1 kHz, and 44.1 kHz.

Therefore, the input data to the selector 9 are the data sampled by sampling pulses having the sampling frequencies of 8 * 44.1 kHz, 4 * 44.1 kHz, 2 * 44.1 kHz, and 44.1 kHz, one of which is selected by the selector 9 in accordance with the selection signal supplied thereto. Accordingly, the output data selected by the selector 9 is one of the data sampled by sampling pulses having the sampling frequencies of 8 * 44.1 kHz, 4 * 44.1 kHz, 2 * 44.1 kHz, and 44.1 kHz.

Figure 2:
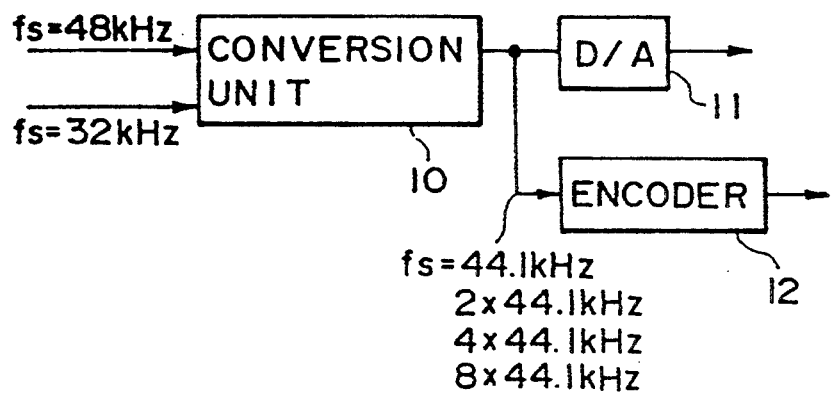
FIG. 2 is a block diagram showing an example of the application of the embodiment converter.
Figure 3:
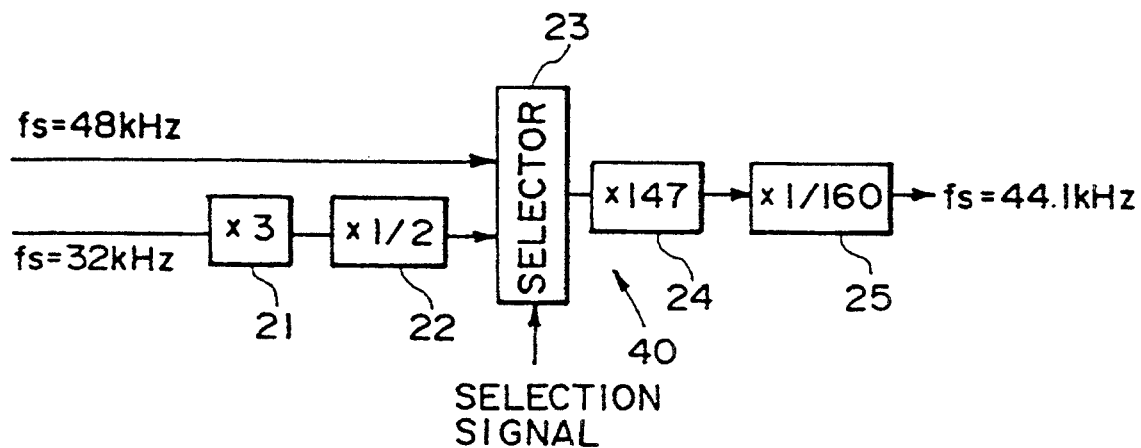
FIG. 3 is a block diagram showing the structure of a conventional sampling frequency converter.
Figure 4:
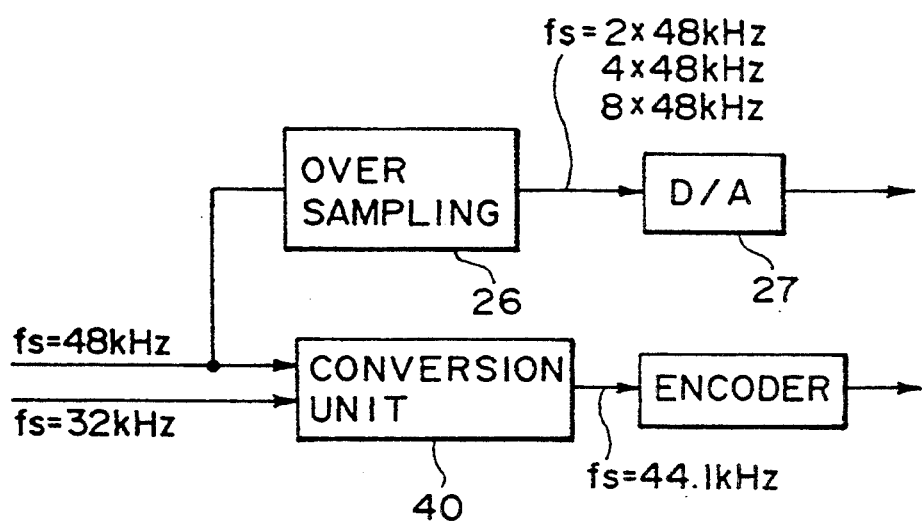
FIG. 4 is a block diagram showing an example of the application of a conventional sampling frequency converter.
Figure 5:
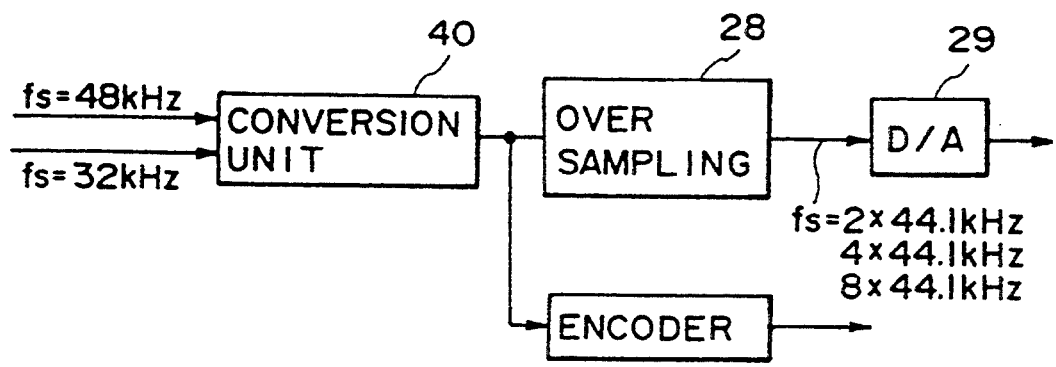
FIG. 5 is a block diagram showing another example of the application of a conventional sampling frequency converter.
Figure 6:
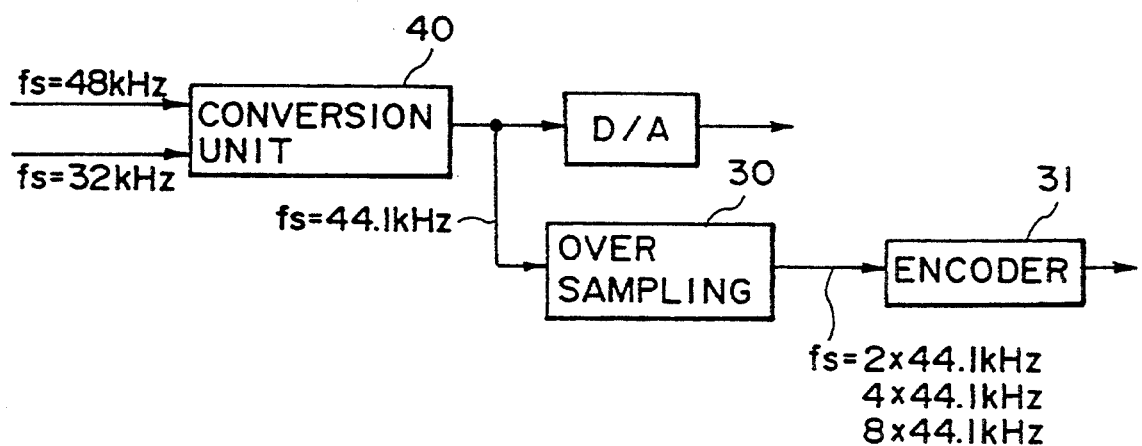
FIG. 6 is a block diagram showing another example of the application of a conventional sampling frequency converter.

As shown in FIG. 2, by supplying the output of the sampling frequency converter 10 of this embodiment to a D/A converter 11 and converting it into an analog signal, it is possible to obtain an analog signal converted from one of the data sampled by sampling pulses having the sampling frequencies of 8 * 44.1 kHz, 4 * 44.1 kHz, 2 * 44.1 kHz, and 44.1 kHz. In this case, no over-sampling filter is required.

Furthermore, by supplying the output of the sampling frequency converter 10 of this embodiment to an encoder 12, it is possible to obtain an encoded signal of one of the data sampled by sampling pulses having the sampling frequencies of 8 * 44.1 kHz, 4 * 44.1 kHz, 2 * 44.1 kHz, and 44.1 kHz, and to record the encoded signal on a recording medium. Also in this case, no over-sampling filter is required.

As described so far, according to the sampling frequency converter of this invention, in obtaining an analog signal converted from, or in recording on a recording medium, one of output data sampled by sampling pulses having sampling frequencies of 8 * 44.1 kHz, 4 * 44.1 kHz, 2 * 44.1 kHz, and 44.1 kHz, it is not necessary to use an over-sampling filter, thereby preventing the characteristics of sampled data from being degraded.

What is claimed is:

1. A sampling frequency converter comprising:
   a first over-sampling filter for over-sampling by a 3-fold input data sampled by sampling pulses having a sampling frequency of 32 kHz;
   a first down-sampling filter for down-sampling by a one-2nd-fold the output of said first over-sampling filter;
   a first selector for selecting one of input data sampled by sampling pulses having a sampling frequency of 48 kHz and the output data of said first down-sampling filter;
   a second over-sampling filter for over-sampling by a 147-fold the output data of said first selector;
   a second down-sampling filter for down-sampling by a one-20th-fold the output of said second over-sampling filter;
   a plurality of down-sampling filters connected to said second down-sampling filter for producing a plurality of output data respectively sampled by 44.1 kHz, 2×44.1 kHz and 4×44.1 kHz sampling frequencies; and
   a second selector for selecting one of said plurality of output data.

2. The sampling frequency converter of claim 1 wherein the output of said second down-sampling filter is connected to said second selector so that said second selector can further select
   (a) said output of said second down-sampling filter, or
   (b) one of said plurality of output data.

* * * * *